United States Patent
Chou et al.

(10) Patent No.: US 11,217,547 B2
(45) Date of Patent: Jan. 4, 2022

(54) BOND PAD STRUCTURE WITH REDUCED STEP HEIGHT AND INCREASED ELECTRICAL ISOLATION

(71) Applicant: Taiwan Semiconductor Manufacturing Co., Ltd., Hsin-Chu (TW)

(72) Inventors: Shih-Pei Chou, Tainan (TW); Jiech-Fun Lu, Madou Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 16/558,556

(22) Filed: Sep. 3, 2019

(65) Prior Publication Data
US 2021/0066225 A1 Mar. 4, 2021

(51) Int. Cl.
*H01L 23/00* (2006.01)
*H01L 27/146* (2006.01)
*H01L 27/142* (2014.01)

(52) U.S. Cl.
CPC ............. *H01L 24/09* (2013.01); *H01L 24/03* (2013.01); *H01L 27/14621* (2013.01); *H01L 27/14636* (2013.01); *H01L 27/14649* (2013.01)

(58) Field of Classification Search
CPC ........... H01L 27/14627; H01L 27/1462; H01L 27/14654; H01L 27/1464
See application file for complete search history.

(56) References Cited

U.S. PATENT DOCUMENTS

| | | | |
|---|---|---|---|
| 9,035,445 B2 | 5/2015 | Lin et al. | |
| 9,219,032 B2 | 12/2015 | Ramachandran | |
| 9,741,759 B2 | 8/2017 | Park | |
| 10,270,003 B2 | 4/2019 | Cheng | |
| 2009/0085143 A1* | 4/2009 | Park | H01L 27/1464 257/459 |

(Continued)

OTHER PUBLICATIONS

Non-Final Office Action dated Aug. 31, 2020 in connection with U.S. Appl. No. 16/532,781.

(Continued)

*Primary Examiner* — Brian Turner
(74) *Attorney, Agent, or Firm* — Eschweiler & Potashnik, LLC

(57) ABSTRACT

Various embodiments of the present disclosure are directed towards a semiconductor structure including a bond pad disposed within a semiconductor substrate. The semiconductor substrate has a back-side surface and a front-side surface opposite the back-side surface. An upper surface of the semiconductor substrate is vertically below the back-side surface. The bond pad extends through the semiconductor substrate. The bond pad includes a conductive body over the upper surface of the semiconductor substrate and conductive protrusions extending from above the upper surface to below the front-side surface of the semiconductor substrate. A vertical distance between a top surface of the bond pad and the back-side surface of the semiconductor substrate is less than a height of the conductive protrusions. A first bond pad isolation structure extends through the semiconductor substrate and laterally surrounds the conductive protrusions.

20 Claims, 11 Drawing Sheets

(56) References Cited

U.S. PATENT DOCUMENTS

| | | |
|---|---|---|
| 2009/0309232 A1* | 12/2009 | Roy ................. H01L 21/76898 257/774 |
| 2012/0068330 A1 | 3/2012 | Oganesian |
| 2014/0008757 A1* | 1/2014 | Ramachandran ............................ H01L 21/76898 257/506 |
| 2015/0179693 A1 | 6/2015 | Maruyama |
| 2015/0255495 A1 | 9/2015 | Park |
| 2015/0311247 A1* | 10/2015 | Chen ................. H01L 27/14621 257/432 |
| 2015/0318323 A1 | 11/2015 | Borthakur |
| 2017/0117316 A1* | 4/2017 | Hsu ................... H01L 27/14603 |
| 2017/0141146 A1 | 5/2017 | Belsher |
| 2017/0186802 A1* | 6/2017 | Huang ................ H01L 27/1464 |
| 2018/0084238 A1* | 3/2018 | Chossat ............. H01L 27/1469 |
| 2018/0240833 A1 | 8/2018 | Tai |
| 2019/0148439 A1 | 5/2019 | Shin |
| 2020/0373344 A1 | 11/2020 | Tung |

OTHER PUBLICATIONS

Notice of Allowance dated Dec. 24, 2020 in connection with U.S. Appl. No. 16/532,781.
U.S. Appl. No. 16/532,781, filed Aug. 6, 2019.

* cited by examiner

BOND PAD STRUCTURE WITH REDUCED STEP HEIGHT AND INCREASED ELECTRICAL ISOLATION

BACKGROUND

Integrated circuits (ICs) with image sensors are used in a wide range of modern day electronic devices, such as cameras and cell phones, for example. Complementary metal-oxide semiconductor (CMOS) devices have become popular IC image sensors. Compared to charge-coupled devices (CCD), CMOS image sensors are increasingly favored due to low power consumption, small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
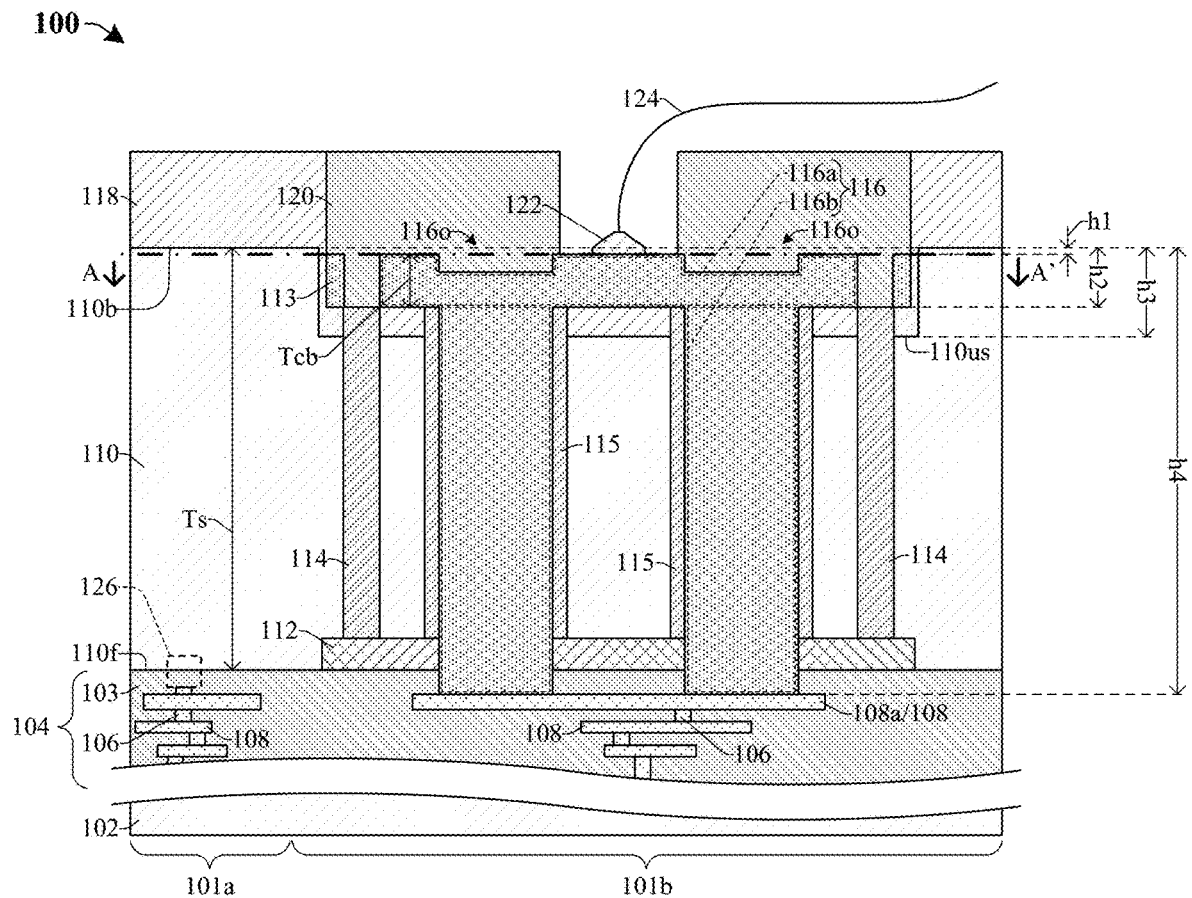
FIG. 1 illustrates a cross-sectional view of some embodiments of an integrated chip (IC) including a bond pad extending through a semiconductor substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some complementary metal-oxide-semiconductor (CMOS) image sensors include an array of pixels sensors arranged within a pixel array region of a substrate of an integrated circuit (IC). The pixel sensors each include a plurality of photodetectors arranged within the substrate in proximity to a back-side of the substrate, so that the photodetectors are able to receive light along the back-side of the substrate. An array of color filters is arranged over the pixel sensor array and is buried within a dielectric layer that overlies the back-side of the substrate. Burying the color filter array within the dielectric layer advantageously improves the quantum efficiency (QE) of the image sensors. Bond pads are disposed within a bond pad region that is a peripheral region of the substrate laterally offset from the pixel array region. The bond pads are formed before performing the buried color filter array (BCFA) process. For example, a bond pad is formed within a bond pad opening and is vertically offset from the back-side of the substrate by a step height. Forming the bond pad opening may include removing an entire thickness of the substrate above a shallow trench isolation structure (STI), such that the bond pad does not extend through the substrate. The buried color filter array (BCFA) process is carried out after forming the bond pad. For example, the dielectric layer is formed over the back-side of the substrate and fills a remaining portion of the bond pad opening. Subsequently, the array of color filters may be formed in and/or over the dielectric layer in a region laterally offset from the bond pad.

In some embodiments, challenges with the aforementioned structure arise as the thickness of the substrate increases. As the thickness of the substrate increases (e.g., to a range of about 3.5-6 micrometers) an intrinsic absorption coefficient of the substrate material (e.g., silicon) increases, thereby increasing the quantum efficiency (QE) of the image sensor. However, as the substrate thickness increases, so does the step height (e.g., from about 2.75 to about 5.75 micrometers) between the bond pad and the back-side of the substrate. Because of the increased step height, the dielectric layer within the bond pad opening is unable to uniformly fill gaps around and/or over the bond pad (e.g., due to a limitation in tools used to form the dielectric layer). This results in cracking and/or delamination of layers adjacent to the bond pad. Additional processing steps (e.g., additional dielectric depositions and/or patterning processes) may be carried out to fill the gaps, however this increases time and costs associated with fabricating the IC. Further, by disposing the bond pad over the shallow trench isolation (STI) structure, such that the bond pad does not extend through the substrate, noise in the image sensor may be reduced, but this will contribute to the increased step height.

Accordingly, in some embodiments, the present disclosure relates to a bond pad with a decreased step height and an associated method for forming the bond pad that simplifies the process for filling a bond pad opening. In some embodiments, a passivation layer is formed over a back-side of a substrate. The passivation layer and the substrate are patterned to form the bond pad opening. The patterning process defines an upper surface of the substrate vertically below the back-side. The bond pad opening includes bond pad protrusion openings that extend through an entire thickness of the substrate and expose an upper surface of a metal line within an underlying interconnect structure. A first bond pad isolation structure is formed in the substrate around the bond pad protrusion openings, and a second bond pad isolation structure is formed along sidewalls of the substrate that define the bond pad protrusion openings. Subsequently, a bond pad is formed in the bond pad opening, such that the bond pad has an upper conductive body overlying the upper surface of the substrate and conductive protrusions extending from the conductive body to the metal line. Subsequently, the dielectric layer is formed over the passivation layer and fills a remaining portion of the bond pad opening. By forming the bond pad over the upper surface of the substrate, the step height is reduced (e.g., to about 0 to 1.80 micrometers) and a thickness of the dielectric layer in the bond pad opening is reduced. This, in part, may mitigate and/or eliminate cracking and/or delamination of layers adjacent to the bond pad. Further, the first and second bond pad isolation structures separate the bond pad from the substrate, thereby decreasing and/or eliminating "leakage" between the bond pad and the photodetectors. This may decrease noise present in the image sensor.

FIG. 1 illustrates a cross-sectional view of some embodiments of an integrated chip 100 having a bond pad 116 disposed within a bond pad region 101b.

The integrated chip 100 includes an interconnect structure 104 disposed along a front-side 110f of a semiconductor substrate 110 (e.g., a silicon substrate). The interconnect structure 104 overlies a carrier substrate 102 (e.g., a silicon substrate), where the interconnect structure 104 is disposed between the semiconductor substrate 110 and the carrier substrate 102. The interconnect structure 104 includes a plurality of interconnect layers arranged within an interconnect dielectric structure 103. The plurality of interconnect layers alternate between conductive wires 108 and conductive vias 106. The conductive wires 108 are configured to provide a lateral connection (i.e., a connection parallel to an upper surface of the carrier substrate 102), whereas the conductive vias 106 are configured to provide for a vertical connection between adjacent conductive wires 108. The conductive wires 108 include an upper conductive wire layer 108a. A passivation structure 118 overlies a back-side 110b of the semiconductor substrate 110. A first dielectric layer 120 overlies the passivation structure 118. A shallow trench isolation (STI) structure 112 is disposed within the semiconductor substrate 110 and extends along an upper surface of the interconnect dielectric structure 103.

The bond pad region 101b extends through the semiconductor substrate 110, at a location laterally offset from a device region 101a, to the upper conductive wire layer 108a. In some embodiments, the device region 101a includes one or more semiconductor devices 126 (e.g., transistor(s), resistor(s), varactor(s), etc.) and/or photodetectors (not shown) disposed within and/or on the semiconductor substrate 110. The bond pad 116, a first bond pad isolation structure 114, and second bond pad isolation structures 115 are disposed within the bond pad region 101b. The bond pad 116 includes an upper conductive body 116a and conductive protrusions 116b underlying the upper conductive body 116a.

The upper conductive body 116a comprises a same material (e.g., aluminum copper) as the conductive protrusions 116b. The upper conductive body 116a overlies the upper surface 110us of the semiconductor substrate and is separated from the upper surface 110us by the passivation structure 118. Further, the conductive protrusions 116b continuously extend through the semiconductor substrate 110, the STI structure 112, and the interconnect dielectric structure 103. Furthermore, the upper conductive body 116a has sidewalls that define bond pad openings 116o overlying the conductive protrusions 116b. An electrical connector pad 122 is disposed laterally between the bond pad openings 116o and provides a wire bonding location for a conductive wire 124. In some embodiments, the conductive wire 124 is bonded to another integrated chip (not shown), where the interconnect structure 104 is electrically coupled to the another integrated chip by way of the bond pad 116. A conductive ring structure 113 is disposed over the upper surface 110us of the semiconductor substrate 110 and laterally surrounds the upper conductive body 116a.

The first bond pad isolation structure 114 is laterally offset from and surrounds outer sidewalls of the bond pad 116. In some embodiments, the first bond pad isolation structure 114 comprises a material (e.g., silicon dioxide) different from the semiconductor substrate 110. Thus, the first bond pad isolation structure 114 is configured to increases electrical isolation between the bond pad 116 and other devices (e.g., the semiconductor devices 126) disposed on and/or within the semiconductor substrate 110. Further, the second bond pad isolation structures 115 respectively surround and/or directly contact an adjacent conductive protrusion 116b. The second bond pad isolation structures 115 each extend from the upper conductive body 116a to the STI structure 112. This further increases electrical isolation between the bond pad 116 and other devices disposed on and/or within the semiconductor substrate 110. By virtue of the first bond pad isolation structure 114 and/or the second bond pad isolation structures 115 surrounding the bond pad 116, "leakage" (i.e., a flow of current) between the bond pad 116 and the other devices and/or doped regions disposed within and/or on the semiconductor substrate 110 may be mitigated and/or eliminated. This, in part, may increase a reliability and/or endurance of the integrated chip 100.

A top surface of the bond pad 116 is vertically offset from the back-side 110b of the semiconductor substrate 110 by a step height h1. In some embodiments, the step height h1 is within a range of 0 to 1.80 micrometers. In some embodiments, if the step height h1 is greater than 0 micrometers, then a thickness of the first dielectric layer 120 overlying the bond pad 116 may be decreased, such that the first dielectric layer 120 may uniformly fill gaps around and/or over the bond pad 116 during fabrication of the integrated chip 100. This increases reliability and/or endurance of the integrated chip 100. In further embodiments, if the step height h1 is less than 0 micrometers, then the bond pad 116 may adversely interact with electromagnetic radiation (e.g., reflect the electromagnetic radiation) disposed upon the back-side 110b of the semiconductor substrate 110. For example, this may decrease sensitivity of photodetectors disposed within the device region 101a of the semiconductor substrate 110 and/or increase noise present in the integrated chip 100. In yet further embodiments, if the step height h1 is greater than 1.80 micrometers, then the first dielectric layer 120 may not uniformly fill gaps around and/or over the bond pad 116, such that the unfilled gaps may cause cracking and/or delamination of layers adjacent to the bond pad 116.

In some embodiments, a lower surface of the upper conductive body 116a has a second height h2, as measured from the back-side 110b of the semiconductor substrate 110. The second height h2 is greater than the step height h1. The upper surface 110us of the semiconductor substrate 110 has a third height h3, as measured from the back-side 110b of the semiconductor substrate 110. The third height h3 is greater than the step height h1. Further, the lower surface of the conductive protrusions 116b has a fourth height h4, as measured from the back-side 110b of the semiconductor substrate 110. The fourth height is greater than the step height h1 and is greater than a thickness Ts of the semiconductor substrate 110. In further embodiments, the top surface of the bond pad 116 may be aligned with the back-side 110b of the semiconductor substrate 110 (e.g., the step height h1 may be zero). In yet further embodiments, the top surface of the bond pad 116 may not be disposed above the back-side 110b of the semiconductor substrate 110 (e.g., the step height h1 may not be negative). In some embodiments, a thickness Tcb of the upper conductive body 116a is about 1.2 micrometers.

Figure 2A:
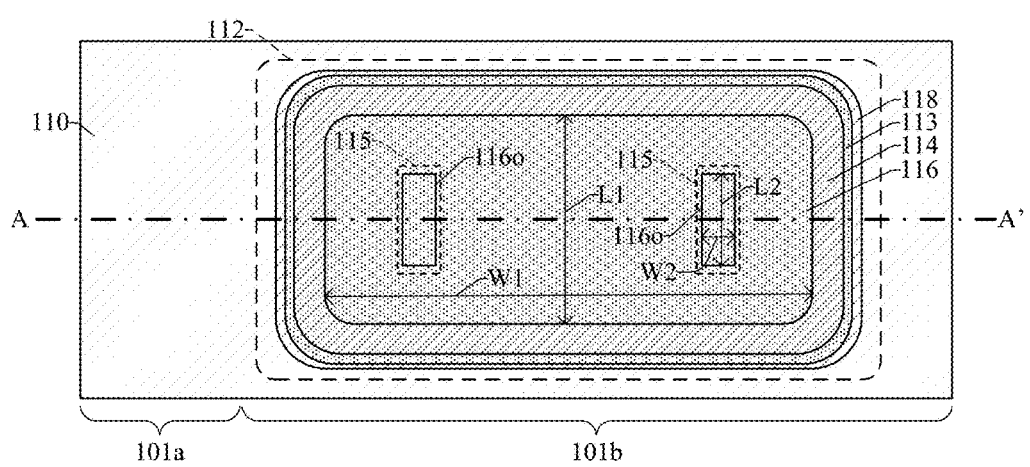
FIGS. 2A-B illustrate top views of some alternative embodiments of the IC of FIG. 1 taken along the line A-A'.

FIG. 2A illustrates a top view of some alternative embodiments of the integrated chip 100 taken along line A-A' of FIG. 1. For ease of illustration, the first dielectric layer 120 of FIG. 1 has been omitted from the top view of FIG. 2A.

The first bond pad isolation structure 114 has a ring like shape, where sidewalls of the first bond pad isolation structure 114 completely surround outer sidewalls of the bond pad 116. When viewed from above, the first bond pad isolation structure 114 has a rectangular/square shape with rounded edges, however the first bond pad isolation structure 114 may have other shapes, such as a circular/elliptical shape. When viewed from above, the bond pad 116 has a rectangular/square shaped with rounded etches, however the bond pad 116 may have other shapes, such as a circular/elliptical shape. In some embodiments, a solder bump (not shown) may be disposed laterally between the bond pad openings 116o.

When viewed from above, the bond pad openings 116o may, for example, have a square/rectangular shape. The second bond pad isolation structures 115 completely surrounds an outer perimeter of the conductive protrusions (116b of FIG. 1) of the bond pad 116. In such embodiments, the second bond pad isolation structures 115 may each have a shape that corresponds to an adjacent bond pad opening 116o. Thus, the second bond pad isolation structures 115 separate the bond pad 116 from the semiconductor substrate 110, thereby electrically isolating the bond pad 116 from other semiconductor devices and/or doped regions within and/or on the semiconductor substrate 110. However, in some embodiments, a thickness of the second bond pad isolation structure 115 may not be substantially thick enough such that "leakage" may occur between the bond pad 116 and the semiconductor substrate 110. In such embodiments, the first bond pad isolation structure 114 further increases the electrical isolation of the bond pad 116 from the semiconductor substrate 110. This, in part, mitigates and/or eliminates "leakage" between the bond pad 116 and the other semiconductor devices and/or doped regions disposed within and/or on the semiconductor substrate 110. A shown in the cross-sectional view of FIG. 1, the STI structure 112 directly underlies the first bond pad isolation structure 114. In some embodiments, outer sidewalls of the bond pad 116 and/or outer sidewalls of the first bond pad isolation structure 114 are each laterally spaced between outer sidewalls of the STI structure 112. In further embodiments, the first bond pad isolation structure 114 is disposed around a center of the bond pad 116.

In some embodiments, the bond pad 116 may have a length L1 and a width W1. The length L1 may, for example, be within a range of about 75 to 85 micrometers. The width W1 may, for example, be within a range of about 85 to 95 micrometers. In some embodiments, the width W1 is greater than the length L1. In some embodiments, the bond pad openings 116o may each have a length L2 and a width W2. The length L2 may, for example, be within a range of about 15 to 25 micrometers. The width W2 may, for example, be within a range of about 2 to 8 micrometers. In some embodiments, the length L2 is greater than the width W2.

Figure 2B:
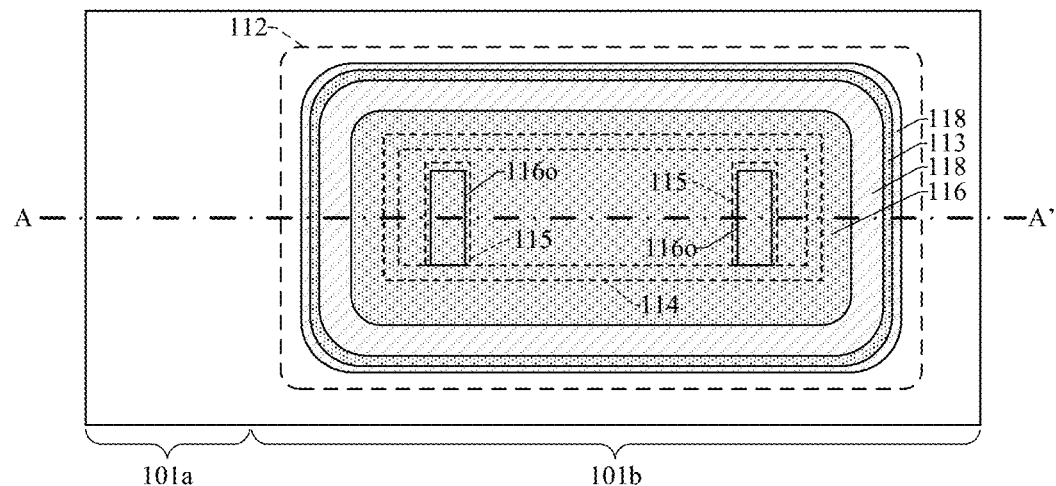

FIG. 2B illustrates a top view of some alternative embodiments of the integrated chip 100 taken along line A-A' of FIG. 1. For ease of illustration, the first dielectric layer 120 of FIG. 1 has been omitted from the top view of FIG. 2B.

As illustrated in FIG. 2B, an inner sidewall of the first bond pad isolation structure 114 is in direct contact with a sidewall of at least one of the conductive protrusions (116b of FIG. 1) of the bond pad 116. Further, outer sidewalls of the first bond pad isolation structure 114 are laterally spaced between outer sidewalls of the bond pad 116.

Figure 3:
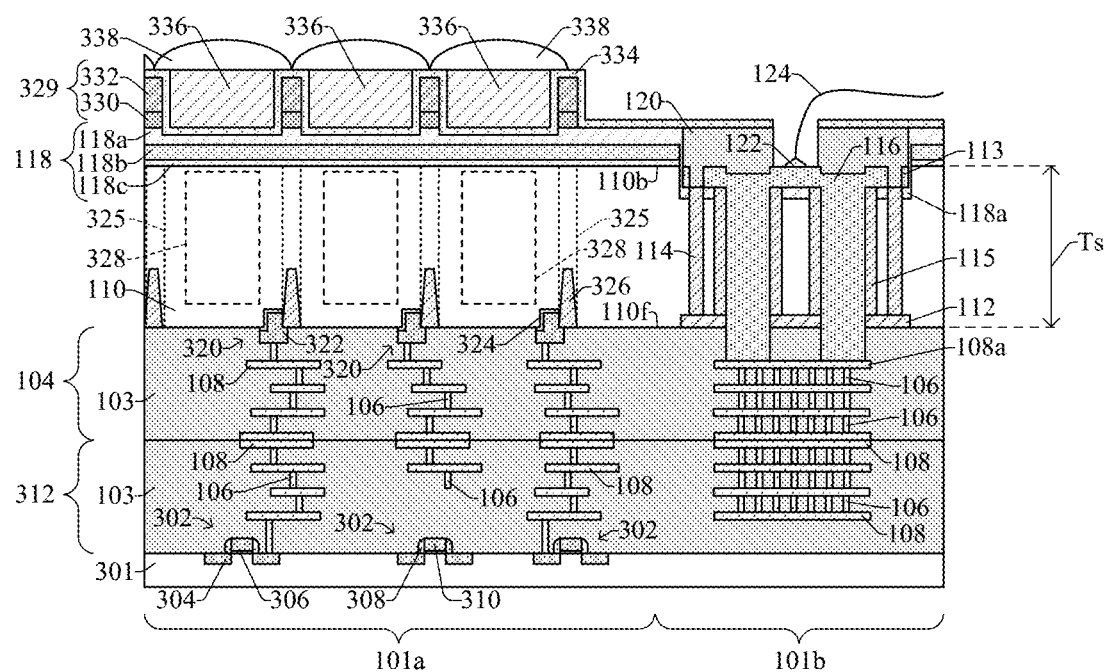
FIG. 3 illustrates a cross-sectional view of some embodiments of an image sensor including a bond pad laterally offset from a plurality of photodetectors.

FIG. 3 illustrates a cross-sectional view of some embodiments of an image sensor 300 that includes a bond pad 116 laterally offset from a plurality of photodetectors 328.

A semiconductor substrate 110 overlies an application specific integrated circuit (ASIC) substrate 301. In some embodiments, the semiconductor substrate 110 and/or the ASIC substrate 301 may respectively, for example, be a bulk substrate (e.g., a bulk silicon substrate), a silicon-on-insulator (SOI) substrate, a silicon germanium (SiGe) substrate, or some other suitable substrate. A plurality of transistors 302 are disposed over the ASIC substrate 301. The transistors 302 each comprise a gate electrode 310, a gate dielectric 306, a sidewall spacer structure 308, and source/drain regions 304. An interconnect structure 104 and an ASIC interconnect structure 312 are disposed between the semiconductor substrate 110 and the ASIC substrate 301. The interconnect structure 104 and the ASIC interconnect structure 312 each comprise an interconnect dielectric structure 103, a plurality of conductive wires 108, and a plurality of conductive vias 106. The interconnect structure 104 and the ASIC interconnect structure 312 are configured to electrically couple the transistors 302 to the photodetectors 328 and/or transfer transistors 320 disposed in the semiconductor substrate 110. In some embodiments, the transfer transistors 320 each comprise a dielectric transfer layer 324 overlying a transfer electrode 322. The semiconductor substrate 110 is bonded to the ASIC substrate 301 by way of the interconnect structure 104 and the ASIC interconnect structure 312. In some embodiments, the conductive wires 108 and/or the conductive vias 106 may respectively, for example, be or comprise aluminum, copper, aluminum copper, tungsten, or the like. In some embodiments, the interconnect dielectric structure 103 may, for example, comprise one or more dielectric layers (e.g., silicon dioxide). In further embodiments, the ASIC substrate 301 may be configured as the carrier substrate 102 of FIG. 1. In such embodiments, the ASIC interconnect structure 312 may be omitted.

The plurality of photodetectors 328 are disposed within the semiconductor substrate 110. In some embodiments, the photodetectors 328, the transistors 302, and the transfer transistors 320 are laterally spaced within the device region 101a. The semiconductor substrate 110 may have a first doping type (e.g., p-type) and the photodetectors 328 may each have a second doping type (e.g., n-type) opposite the first doping type. In some embodiments, the photodetectors 328 respectively extend from a back-side 110b of the semiconductor substrate 110 to a point below the back-side 110b. In further embodiments, the point is at a front-side 110f of the semiconductor substrate 110, which is opposite the back-side 110bs of the semiconductor substrate 110. In some embodiments, isolation structures 325, 326 may be disposed within the semiconductor substrate 110 laterally disposed between adjacent photodetectors 328. For example, a shallow trench isolation (STI) structure 326 may be disposed into the front-side 110f of the semiconductor substrate 110 to a point above the transfer transistors 320. The isolation structures 326 may be configured as STI structures and may, for example, be or comprise silicon dioxide, silicon nitride, or the like. Further, an elongated isolation structure 325 may extend from the isolation structures 326 to the back-side 110b of the semiconductor substrate 110. The elongated isolation structures 325 may be configured as deep trench isolation (DTI) structures and/or may be doped regions of the semiconductor substrate 110 configured to electrically isolate the photodetectors 328 from one another.

The photodetectors 328 are each configured to convert electromagnetic radiation (e.g., photons) into electrical signals (e.g., to generate electron-hole pairs from the electromagnetic radiation). In some embodiments, the photodetectors 328 may, for example, each be configured to generate electrical signals from near infrared radiation (NIR) electromagnetic radiation (e.g., wavelength of about 0.7-5 micrometers). In such embodiments, a material and/or a thickness Ts of the semiconductor substrate 110 is configured to ensure the photodetectors 328 have high quantum efficiency (QE) in NIR applications. For example, the thickness Ts of the semiconductor substrate 110 may be within a range of about 3.5 to 6 micrometers. In some embodiments, if the thickness Ts is greater than about 3.5 micrometers, then the photodetectors 328 will each have enhanced NIR light QE, and this may have an increased ability for phase detection and/or depth detection. In further embodiments, if the thickness Ts is less than about 6 micrometers, then the photodetectors 328 will each have enhanced NIR light QE while mitigating complexity, costs, and time associated with fabricating the image sensor 300. In yet further embodiments, the photodetectors 328 may, for example, each be configured to generate electrical signals from visible light (e.g., wavelength of about 0.38 to 0.75 micrometers).

The passivation structure 118 overlies the back-side 110b of the semiconductor substrate 110 and comprises a first passivation layer 118a, a second passivation layer 118b, and a third passivation layer 118c. The first passivation layer 118a may, for example, be or comprise an oxide, such as silicon dioxide, a low-k dielectric material, or the like. The first passivation layer 118a may directly contact the bond pad 116. The second passivation layer 118b may, for example, be or comprise an oxide, such as silicon dioxide, a low-k dielectric material, or the like. The third passivation layer 118c may, for example, be or comprise a high-k dielectric material, or some other suitable dielectric material. The passivation structure 118 may be configured to protect the back-side 110b of the semiconductor substrate 110.

A grid structure 329 overlies the passivation structure 118. The grid structure 329 includes a first grid layer 330 and a second grid layer 332 overlying the first grid layer 330. The grid structure 329 is laterally around and between the photodetectors 328 to define a plurality of color filter openings. A dielectric protection layer 334 may be disposed along an upper surface and sidewalls of the grid structure 329. In some embodiments, the dielectric protection layer 334 may be configured as a sidewall protection structure that prevents damage to the grid structure 329. The dielectric protection layer 334 may, for example, be or comprise an oxide, such as silicon dioxide, or another suitable dielectric material. A plurality of light filters 336 are arranged within the plurality of color filter openings and overlies the plurality of photodetectors 328. The grid structure 329 may comprise a dielectric material with a refractive index less than a refractive index of the light filters 336. Due to the lower refractive index, the grid structure 329 serves as a radiation guide to direct incident electromagnetic radiation (e.g., NIR light) to a corresponding photodetector 328. Further, the light filters 336 are each configured to block a first range of frequencies of the incident electromagnetic radiation while passing a second range of frequencies (different than the first range of frequencies) of the incident electromagnetic radiation to an underlying photodetector 328. In some embodiments, the second range of frequencies may be NIR light. In yet further embodiments, the plurality of color filters may be configured as a buried color filter array (BCFA), such that the second range of frequencies may be visible light. Further, a plurality of micro-lenses 338 may be disposed over the plurality of light filters 336.

The device region 101a is laterally offset from a bond pad region 101b of the image sensor 300. A bond pad 116 and a first bond pad isolation structure 114 are laterally arranged within the bond pad region 101b of the image sensor 300. Thus, in some embodiments, the bond pad 116 and the first bond pad isolation structure 114 are laterally offset from the photodetectors 328 and/or the transfer transistors 320 by a non-zero distance.

The bond pad 116 is configured to electrically coupled the transfer transistors 320, the transistors 302, and/or the photodetectors 328 to another integrated chip (not shown) by way of the interconnect structure 104 and/or the ASIC interconnect structure 312. In some embodiments, the bond pad 116 is separated from an upper surface of the semiconductor substrate 110 by the first passivation layer 118a and has protrusions extending through the semiconductor substrate 110 to the upper conductive wire layer 108a. In such embodiments, the protrusions are separated from sidewalls of the semiconductor substrate 110 by a second bond pad isolation structure 115. The protrusions extend through a shallow trench isolation (STI) structure 112 and the interconnect dielectric structure 103. Further, the bond pad 116 has sidewalls that define bond pad openings 116o overlying the protrusions of the bond pad 116. In some embodiments, a height of the bond pad 116 is greater than the thickness Ts of the semiconductor substrate 110. Further, a first dielectric layer 120 is disposed over an upper surface of the bond pad 116 and may have a substantially flat upper surface that is aligned with an upper surface of the first passivation 118a. The first and second bond pad isolation structures 114 and 115 are configured to electrically isolate the bond pad 116 from the photodetectors 328 and/or the transfer transistors 320, thereby preventing a "leakage" (i.e., a flow of current) between the bond pad 116 and the photodetectors 328 and/or the transfer transistors 320. This increases a performance, stability, and reliability of the image sensor 300. The first and/or second bond pad isolation structures 114, 115 may, for example, be or comprise a dielectric material, such as silicon dioxide, silicon nitride, silicon oxynitride, or the like.

Figure 4:
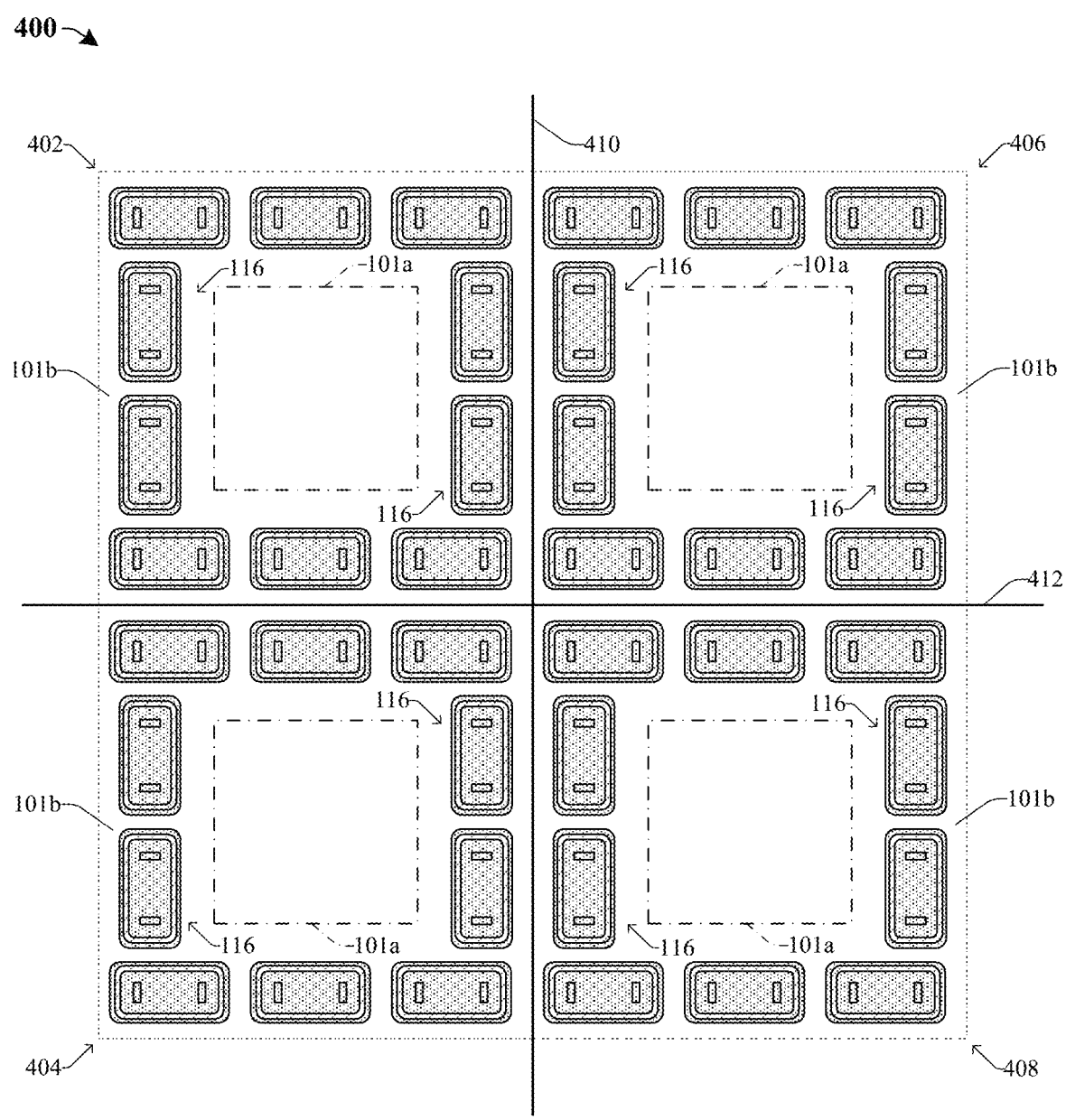
FIG. 4 illustrates a top view of some embodiments of a semiconductor structure including multiple bond pads laterally surrounding device regions.

FIG. 4 illustrates a top view of some embodiments of a semiconductor structure 400 including multiple bond pads 116 laterally surrounding device regions 101a.

As illustrated in FIG. 4, the semiconductor structure 400 includes multiple integrated chip die regions 402-408 spaced next to one another along a first substantially straight line 410 and a second substantially straight line 412. When viewed in cross-section, the multiple integrated chip die regions 402-408 may be disposed along a single semiconductor substrate (e.g., a silicon substrate, such as the semiconductor substrate 110 of FIG. 1), such that each bond pad 116 extends through the single semiconductor substrate. The first substantially straight line 410 extends along a first direction (e.g., along an x-axis) and the second substantially straight line 412 extends along a second direction (e.g., along a y-axis) perpendicular to the first direction. Each integrated chip die region 402-408 includes a device region 101a surrounded by a bond pad region 101b. In some embodiments, the device region 101a may include a plurality of photodetectors and/or transistors and the bond pad region 101b includes a plurality of bond pads 116. The bond pads 116 may each be configured as the bond pad 116 of FIG. 1, such that the bond pads 116 each have a reduced step height (h1 of FIG. 1) that is, for example, within a range of about 0 to 1.80 micrometers.

In some embodiments, during fabrication of the semiconductor structure 400, a dicing process (e.g., performed by a mechanical saw and/or performed by a dicing laser) may be performed along the first and/or second substantially straight lines 410, 412. Thus, the first and second substantially straight lines 410, 412 may be configured as scribe-lines during the dicing process. The dicing process is configured to singulate each integrated chip die region 402-408 into an individual semiconductor die, subsequently the individual semiconductor dies may be bonded to another semiconductor structure (not shown) by way of the bond pads 116. In some embodiments, during the dicing process, conductive and/or dielectric layers and structures adjacent to each bond pad 116 may be prone to cracking and/or delamination. This may be due to a stress induced by the dicing process. However, the reduced step height (h1 of FIG. 1) of each bond pad 116 may mitigate and/or eliminate cracking and/or delamination of layers adjacent to the bond pads 116. This is because the reduced step height (h1 of FIG. 1) of each bond pad 116 facilitates performing a bond pad opening filling process during fabrication of each bond pad 116, such that a dielectric layer (e.g., 120 of FIG. 1) may uniformly fill spaces and/or cracks around the bond pads 116, thereby increasing a performance and endurance of each semiconductor die.

Figure 5:
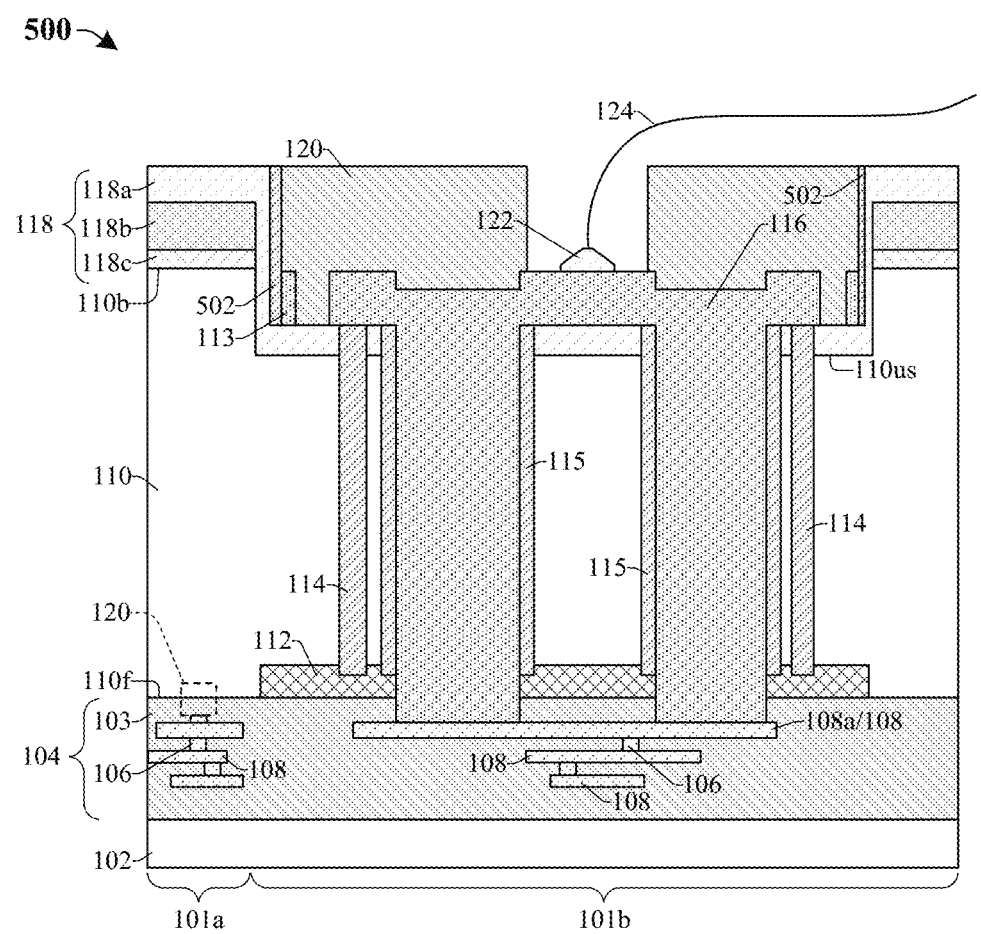
FIG. 5 illustrates a cross-sectional view of an IC according to some alternative embodiments of the IC of FIG. 1.

FIG. 5 illustrates a cross-sectional view of some embodiments of an integrated chip 500 according to alternative embodiments of the integrated chip 100 of FIG. 1. A second dielectric layer 502 is disposed around sidewalls of the bond pad 116. The second dielectric layer 502 is between the first dielectric layer 120 and the first passivation layer 118a. In some embodiments, the second dielectric layer 502 may comprise a same material as the second bond pad isolation structures 115.

FIGS. 6-16 illustrate cross-sectional views 600-1600 of some embodiments of a method for forming a bond pad with a reduced step height and a bond pad isolation structure surrounding the bond pad according to the present disclosure. Although the cross-sectional views 600-1600 shown in FIGS. 6-16 are described with reference to a method, it will be appreciated that the structures shown in FIGS. 6-16 are not limited to the method but rather may stand alone separate of the method. Furthermore, although FIGS. 6-16 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
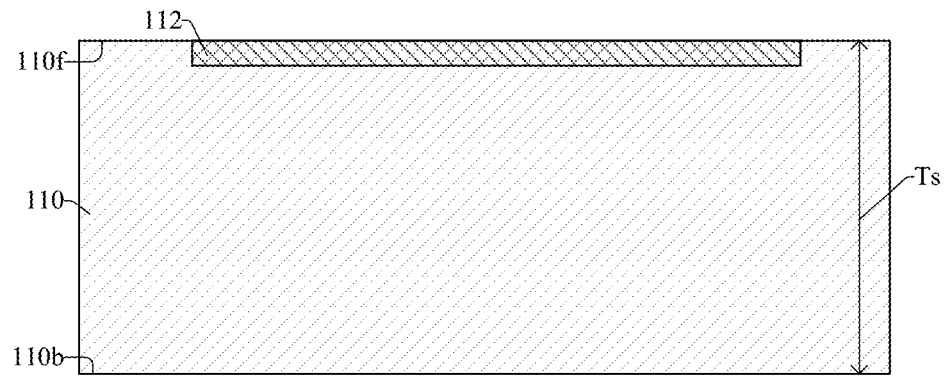
FIGS. 6-16 illustrate a series of cross-sectional views of some embodiments of a method for forming a bond pad with a reduced step height and a bond pad isolation structure surrounding the bond pad.

As shown in cross-sectional view 600 of FIG. 6, a semiconductor substrate 110 is provided and a shallow trench isolation (STI) structure 112 is formed on a front-side 102f of the semiconductor substrate 110. In some embodiments, the semiconductor substrate 110 may, for example, be a bulk substrate (e.g., a bulk silicon substrate), a silicon-on-insulator (SOI) substrate, or some other suitable substrate. In some embodiments, a process for forming the STI structure 112 may include: selectively etching the semiconductor substrate 110 according to a masking layer (not shown) to form a trench that extends into the front-side 102f; and filling (e.g., by chemical vapor deposition (CVD), physical vapor deposition (PVD), atomic layer deposition (ALD), thermal oxidation, etc.) the trench with a dielectric material (e.g., silicon dioxide, silicon carbide, etc.). In some embodiments, a material and/or a thickness Ts of the semiconductor substrate 110 is configured to ensure high quantum efficiency (QE) for photodetectors in NIR applications. For example, the thickness Ts of the semiconductor substrate 110 may be within a range of about 3.5 to 6 micrometers.

Figure 7:
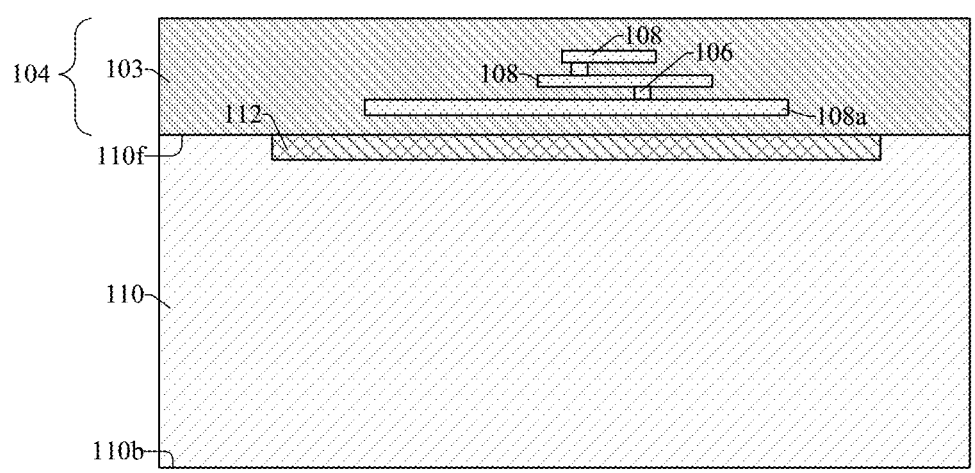

As shown in cross-sectional view 700 of FIG. 7, an interconnect structure 104 is formed on the front-side 110f of the semiconductor substrate 110. The interconnect structure 104 includes an interconnect dielectric structure 103, a plurality of conductive wires 108, and a plurality of conductive vias 106. In some embodiments, the interconnect dielectric structure 103 may be or comprise one or more inter-level dielectric (ILD) layers. The one or more ILD layers may, for example, be or comprise an oxide, such as silicon dioxide, or another suitable oxide. In some embodiments, a process for forming the interconnect structure 104 includes forming the conductive vias 106 and the conductive wires 108 by a single damascene process or a dual damascene process. For example, a first layer of the conductive vias 106 and a first layer of the conductive wires 108 may respectively be formed by a single damascene process. Further, in such embodiments, the process includes forming remaining layers of the conductive wires 108 and the conductive vias 106 by repeatedly performing a dual damascene process. In some embodiments, the conductive wires 108 and/or the conductive vias 106 may respectively, for example, be or comprise aluminum, copper, aluminum copper, tungsten, or the like.

Figure 8:
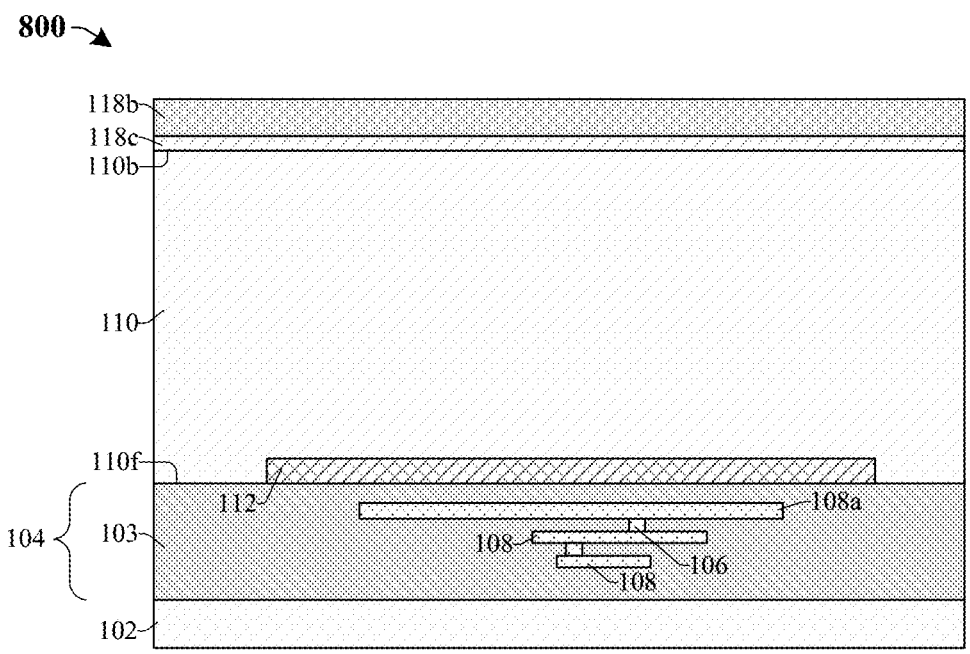

As shown in cross-sectional view 800 of FIG. 8, the structure of FIG. 7 is rotated 180 degrees and the interconnect structure 104 is bonded to a carrier substrate 102. In some embodiments, the bonding process may comprise a fusion bonding process. In some embodiments, the carrier substrate 102 may, for example, be a bulk substrate (e.g., a bulk silicon substrate), a silicon-on-insulator (SOI) substrate, or some other suitable substrate. Further, passivation layers 118b-c are formed on the back-side 110b of the semiconductor substrate 110. In some embodiments, the passivation layers 118b-c may each be deposited or grown by, for example, CVD, PVD, ALD, or another suitable growth or deposition process.

Figure 9:
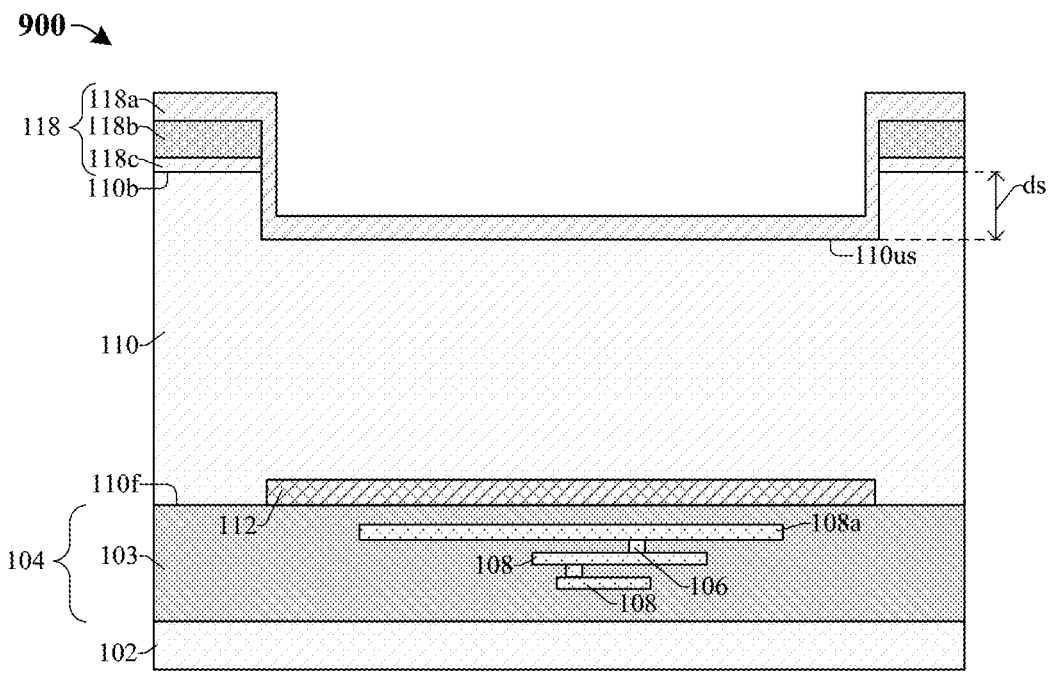

As shown in cross-sectional view 900 of FIG. 9, the structure of FIG. 8 is patterned to form an opening in the passivation layers 118b-c and the semiconductor substrate 110 and define an upper surface 110us of the semiconductor substrate 110. The upper surface 110us is separated from the back-side 110b of the semiconductor substrate 110 by a distance ds. In some embodiments, the distance ds is within a range of about 1.2 to 3 micrometers. In some embodiments, patterning the structure of FIG. 8 may include: forming a masking layer (not shown) over the passivation layers 118b-c; exposing unmasked regions of the passivation layers 118b-c and the semiconductor substrate 110 to one or more etchants; and performing a removal process to remove the masking layer. After performing the patterning process, a first passivation layer 118a is formed over the semiconductor substrate 110, thereby defining a passivation structure 118. The first passivation layer 118a may, for example, be deposited or grown by CVD, PVD, ALD, or another suitable deposition or growth process. The first passivation layer 118a lines sidewalls and the upper surface 110us of the semiconductor substrate 110. The passivation structure 118 overlies the semiconductor substrate 110 and includes the first passivation layer 118a, a second passivation layer 118b, and a third passivation layer 118c. The first passivation layer 118a may, for example, be or comprise an oxide, such as silicon dioxide, a low-k dielectric material, or the like. The first passivation layer 118a may directly contact the bond pad 116. The second passivation layer 118b may, for example, be or comprise an oxide, such as silicon dioxide, a low-k dielectric material, or the like. The third passivation layer 118c may, for example, be or comprise a high-k dielectric material, or some other suitable dielectric material.

Figure 10:
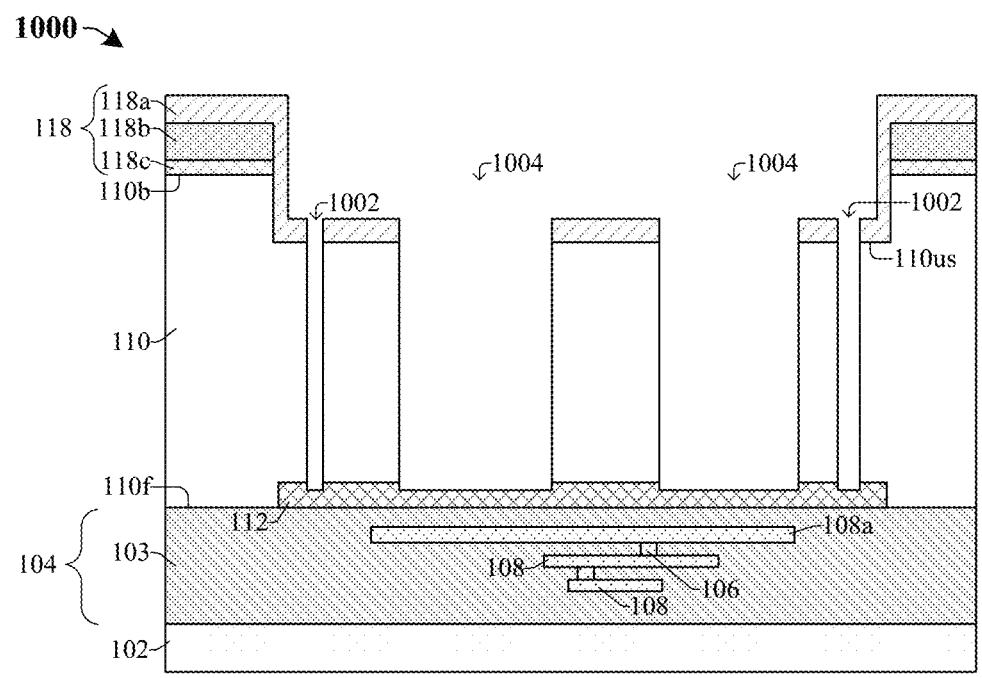

As shown in cross-sectional view 1000 of FIG. 10, the structure of FIG. 9 is patterned, thereby defining a bond pad isolation opening 1002 and bond pad protrusion openings 1004. In some embodiments, the patterning process includes: forming a masking layer (not shown) over the first passivation layer 118a; exposing unmasked regions of the first passivation layer 118a and the semiconductor substrate 110 to one or more etchants, thereby defining the bond pad isolation opening 1002 and the bond pad protrusion openings 1004; and performing a removal process to remove the masking layer. In some embodiments, the patterning process may over-etch and remove at least a portion of the STI structure 112. In other embodiments, the patterning process may stop at a top surface of the STI structure 112, wherein the patterning process does not remove a portion of the STI structure 112 (not shown).

Figure 11:
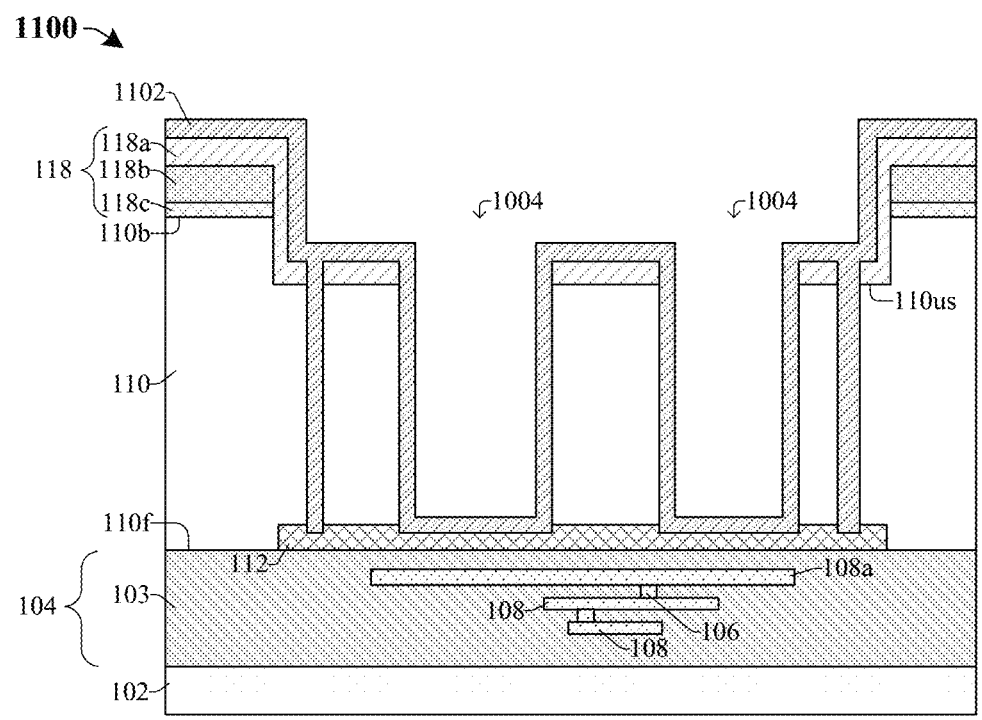

As shown in cross-sectional view 1100 of FIG. 11, a bond pad isolation layer 1102 is formed over the passivation structure 118 and the semiconductor substrate 110. In some embodiments, the bond pad isolation layer 1102 may, for example, be deposited or grown by PVD, CVD, ALD, thermal oxidation, or some other suitable growth or deposition process. The bond pad isolation layer 1102 may, for example, be or comprise a dielectric material, such as silicon dioxide, silicon nitride, silicon oxynitride, or the like. In some embodiments, the bond pad isolation layer 1102 may completely fill the bond pad isolation opening (1002 of FIG. 10) and may line each of the bond pad protrusion openings 1004.

Figure 12:
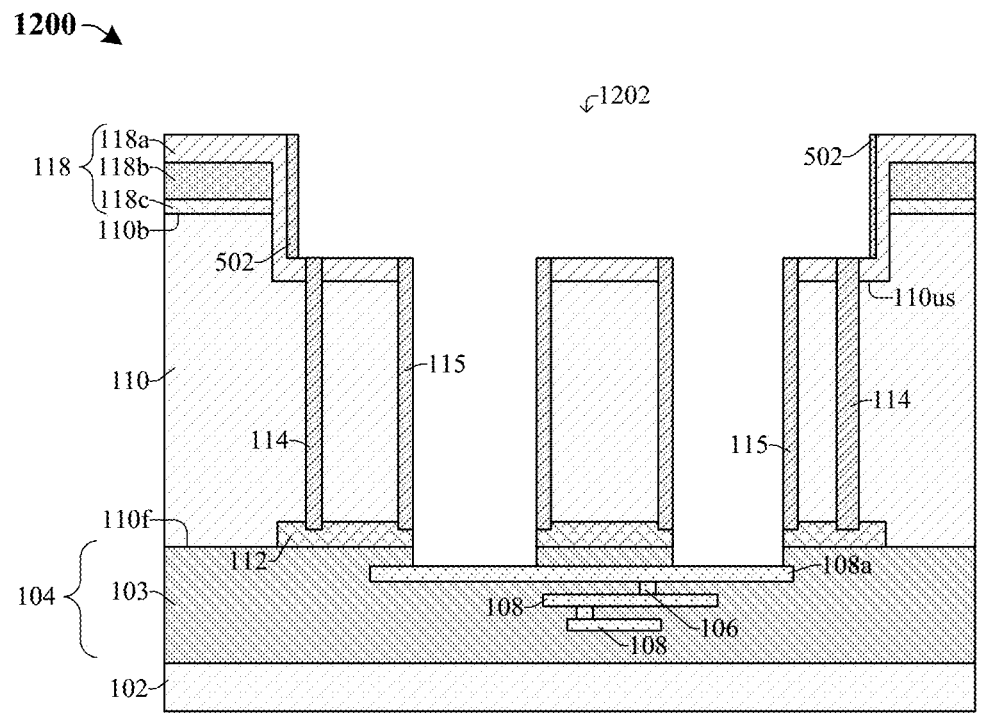

As shown in cross-sectional view 1200 of FIG. 12, a patterning process is performed on the bond pad isolation layer (1102 of FIG. 11), thereby defining a first bond pad isolation structure 114, second bond pad isolation structures 115, a second dielectric layer 502, and a bond pad opening 1202. The patterning process further removes a portion of the STI structure 112 and a portion of the interconnect dielectric structure 103, and exposes an upper surface of an upper conductive wire layer 108a. In some embodiments, the patterning process includes performing a blanket dry etch and/or a wet etch.

Figure 13:
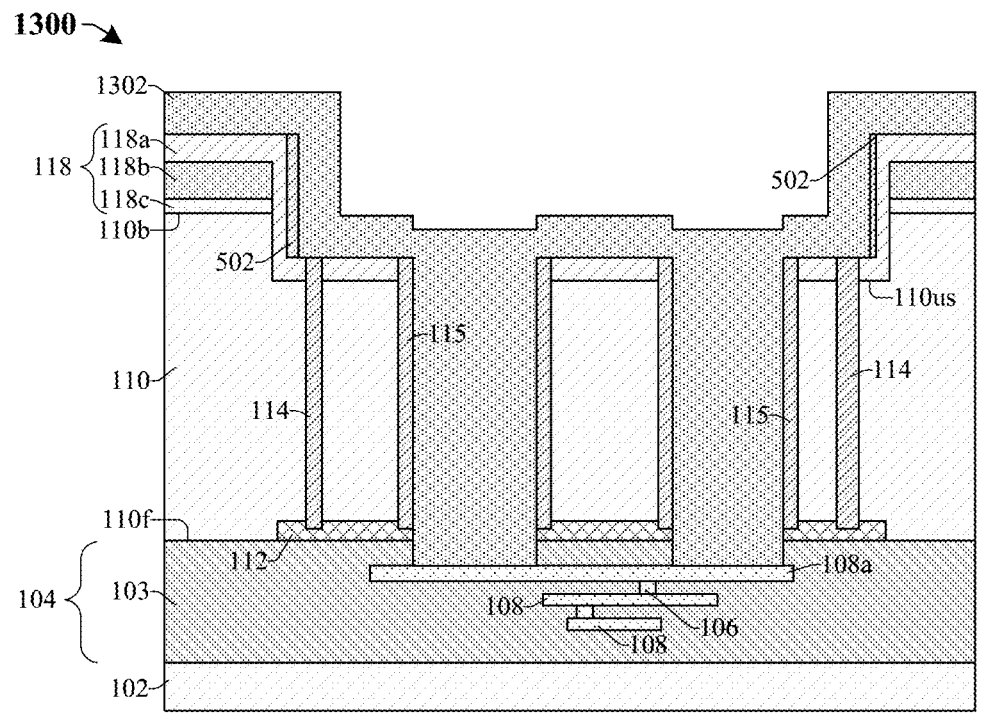

As shown in cross-sectional view 1300 of FIG. 13, a bond pad layer 1302 is formed over the structure of FIG. 12 and fills at least a portion of the bond pad opening (1202 of FIG. 12). In some embodiments, the bond pad layer 1302 may, for example, be deposited and/or grown by electroless plating, electroplating, sputtering, or some other suitable deposition process. In some embodiments, the bond pad layer 1302 may, for example, be or comprise aluminum, copper, aluminum copper, or the like. The bond pad layer 1302 may comprise a same material, for example, as the conductive vias 106 and/or the conductive wires 108.

Figure 14:
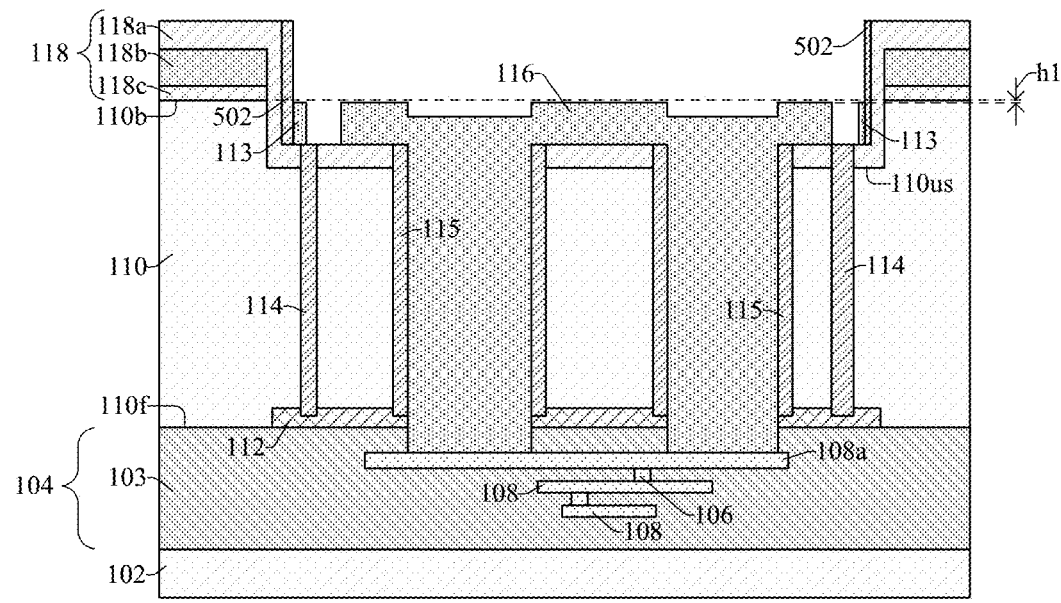

As shown in cross-sectional view 1400 of FIG. 14, the bond pad layer (1302 of FIG. 13) is patterned, thereby defining a bond pad 116 and a conductive ring structure 113. A top surface of the bond pad 116 and/or the conductive ring structure 113 may each be vertically separated from the back-side 110b of the semiconductor substrate 110 by a step height h1. The bond pad 116 and/or the conductive ring structure 113 may each, for example, be or comprise aluminum, copper, aluminum copper, or the like. In some embodiments, the bond pad 116 is laterally offset from the conductive ring structure 113 by a non-zero distance. In further embodiments, patterning the bond pad layer (1302 of FIG. 13) includes: forming a masking layer (not shown) over the bond pad layer (1302 of FIG. 13); exposing unmasked regions of the bond pad layer (1302 of FIG. 13) to one or more etchants, thereby defining the bond pad 116 and the conductive ring structure 113; and performing a removal process to remove the masking layer.

Figure 15:
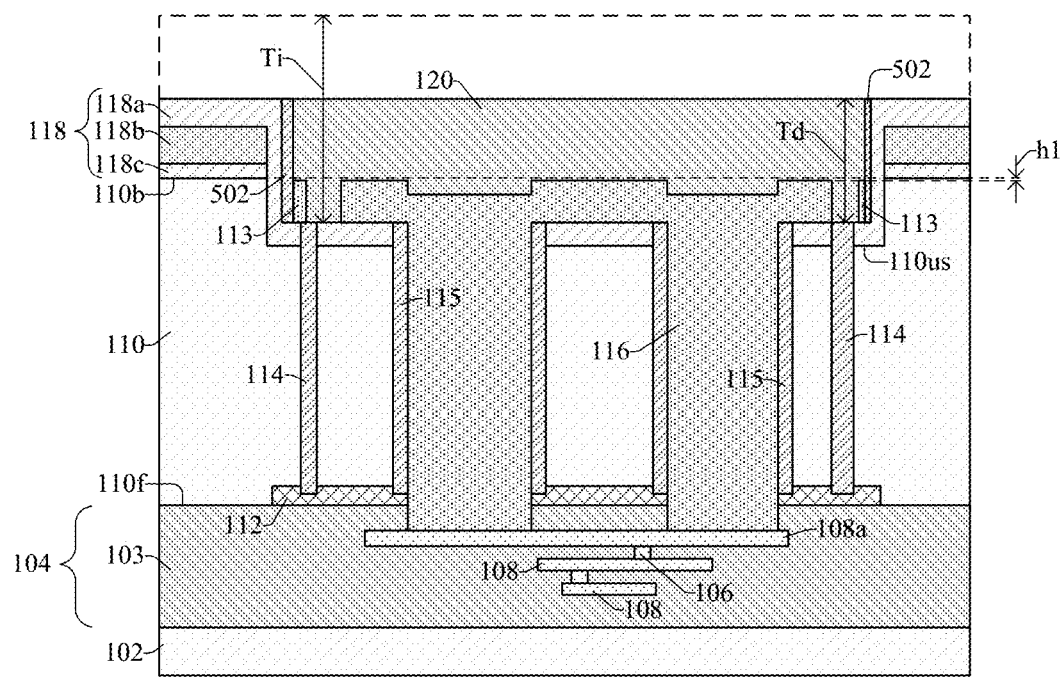

As shown in cross-sectional view 1500 of FIG. 15, a first dielectric layer 120 is formed over the bond pad 116. The first dielectric layer 120 may, for example, be or comprise silicon dioxide, some other suitable dielectric, or the like. In some embodiments, the first dielectric layer 120 may, for example, be deposited or grown by CVD, PVD, ALD, or some other suitable growth or deposition process. In some embodiments, the first dielectric layer 120 is formed with an initial thickness Ti. Subsequently, a planarization process (e.g., a chemical mechanical planarization (CMP) process) may be performed into the first dielectric layer 120 until an upper surface of the first passivation layer 118a is reached. In such embodiments, after the planarization process the first dielectric layer 120 may have a thickness Td that is less than the initial thickness Ti. In further embodiments, the first dielectric layer 120 may have a substantially flat upper surface that is vertically aligned with an upper surface of the first passivation layer 118a. In some embodiments, after performing the planarization process, a BCFA process may be performed, thereby forming light filters over the semiconductor substrate 110 in a region laterally offset from the bond pad 116 (e.g., see FIG. 3).

In some embodiments, the thickness Td is approximately 5, 10, or 15 or more times greater than the step height h1. Because the step height h1 is substantially smaller than the thickness Td of the first dielectric layer 120, the first dielectric layer 120 may be formed in such a manner that gaps around the bond pad 116 are uniformly filled. Further, the planarization process ensures the upper surface of the first dielectric layer 120 above the bond pad 116 is substantially flat (e.g., within the tolerance of a CMP process). This, in turn, further prevents cracking and/or delamination of the first dielectric layer 120 and/or adjacent layers or structures (e.g., the second dielectric layer 502, the bond pad 116, the conductive ring structure 113, etc.) during a subsequent dicing process (not shown). In such embodiments, delamination and/or cracking may be further mitigated if the bond pad 116 is in close proximity to a scribe-line (e.g., see FIG. 4).

In some embodiments, the bond pad 116 may, for example, have been formed within a bond pad region (e.g., 101b of FIG. 3) that is laterally adjacent to a device region (e.g., 101a of FIG. 3) (not shown). In some embodiments, a plurality of photodetectors (e.g., 328 of FIG. 3) may be formed within the semiconductor substrate 110 by a selective ion implant process within the device region before forming the interconnect structure 104 (not shown). Further, one or more semiconductor devices (e.g., 320 of FIG. 3) may be formed on the front-side 110f of the semiconductor substrate 110, within the device region, by one or more etching processes and one or more deposition processes before forming the interconnect structure 104 (not shown). In further embodiments, after forming the first dielectric layer 120, a grid structure (e.g., 329 of FIG. 3) may be formed in the device region, such that the grid structure overlies the photodetectors (not shown). A process for forming the grid structure may, for example, include: performing one or more deposition processes (e.g., CVD, PVD, ALD, etc.) to deposit one or more grid layers over the plurality of photodetectors (not shown); and performing a patterning process according to a masking layer, where the patterning process defines a plurality of color filter openings (not shown) within the device region and directly overlying a corresponding photodetector (not shown). In yet further embodiments, the patterning process may over-etch and remove at least a portion of the first passivation layer 118a within the device region (not shown).

Figure 16:
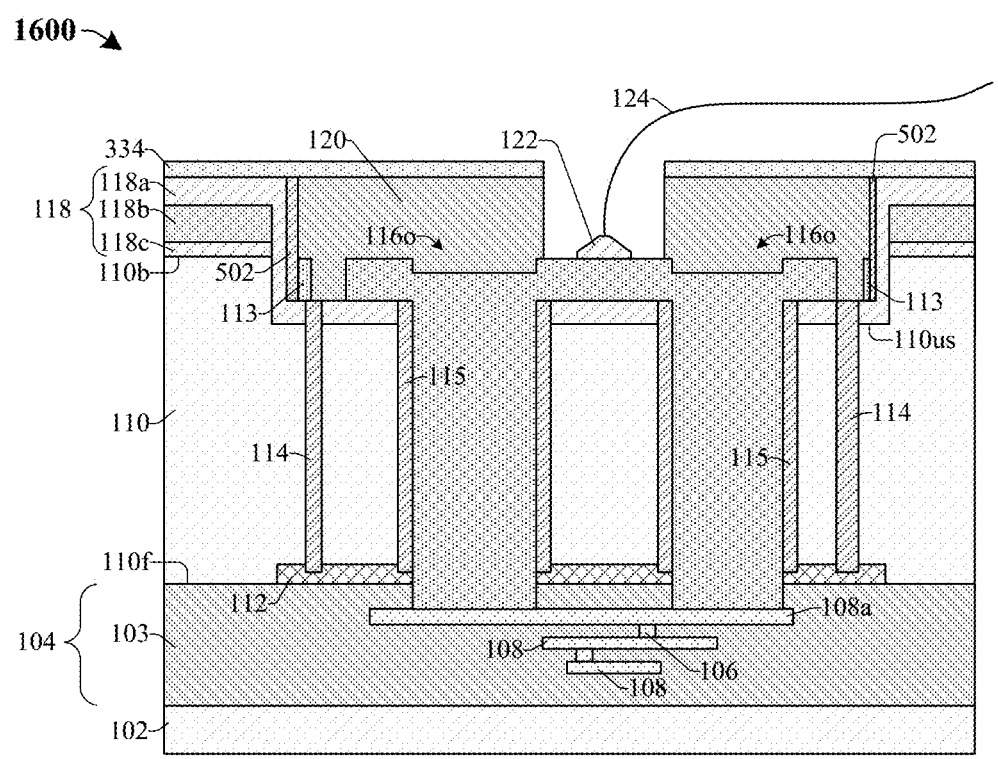

As shown in cross-sectional view 1600 of FIG. 16, a dielectric protection layer 334 is formed over the upper surface of the first dielectric layer 120. In some embodiments, the dielectric protection layer 334 may be deposited or grown by, for example, CVD, PVD, ALD, or some other suitable growth or deposition process. After forming the dielectric protection layer 334, a patterning process may be performed on the first dielectric layer 120 and the dielectric protection layer 334, thereby exposing an upper surface of the bond pad 116 between bond pad openings 116o. After performing the patterning process, an electrical connector pad 122 is formed over the upper surface of the bond pad 116. Subsequently, the bond pad 116 may be electrically coupled to an external integrated chip (not shown) by way of a conductive wire 124.

In some embodiments, the dielectric protection layer 334 at least partially lines the plurality of color filter openings within the device region (not shown). Further, the dielectric protection layer 334 may directly contact the first passivation layer 118a within the device region (e.g., see FIG. 3). In further embodiments, a plurality of light filters (e.g., 336 of FIG. 3) may be formed within the color filter openings (not shown). In such embodiments, the light filters may be deposited by CVD, PVD, or another suitable deposition process. In yet further embodiments, a plurality of micro-lenses (e.g., 338 of FIG. 3) are formed over the plurality of light filters (not shown). In some embodiments, the micro-lenses may be formed by depositing a micro-lens material on the light filters (e.g., by a spin-on method or a deposition process) (not shown). A micro-lens template (not shown) having a curved upper surface is patterned above the micro-lens material. The micro-lenses are then formed by selectively etching the micro-lens material according to the micro-lens template (not shown).

Figure 17:
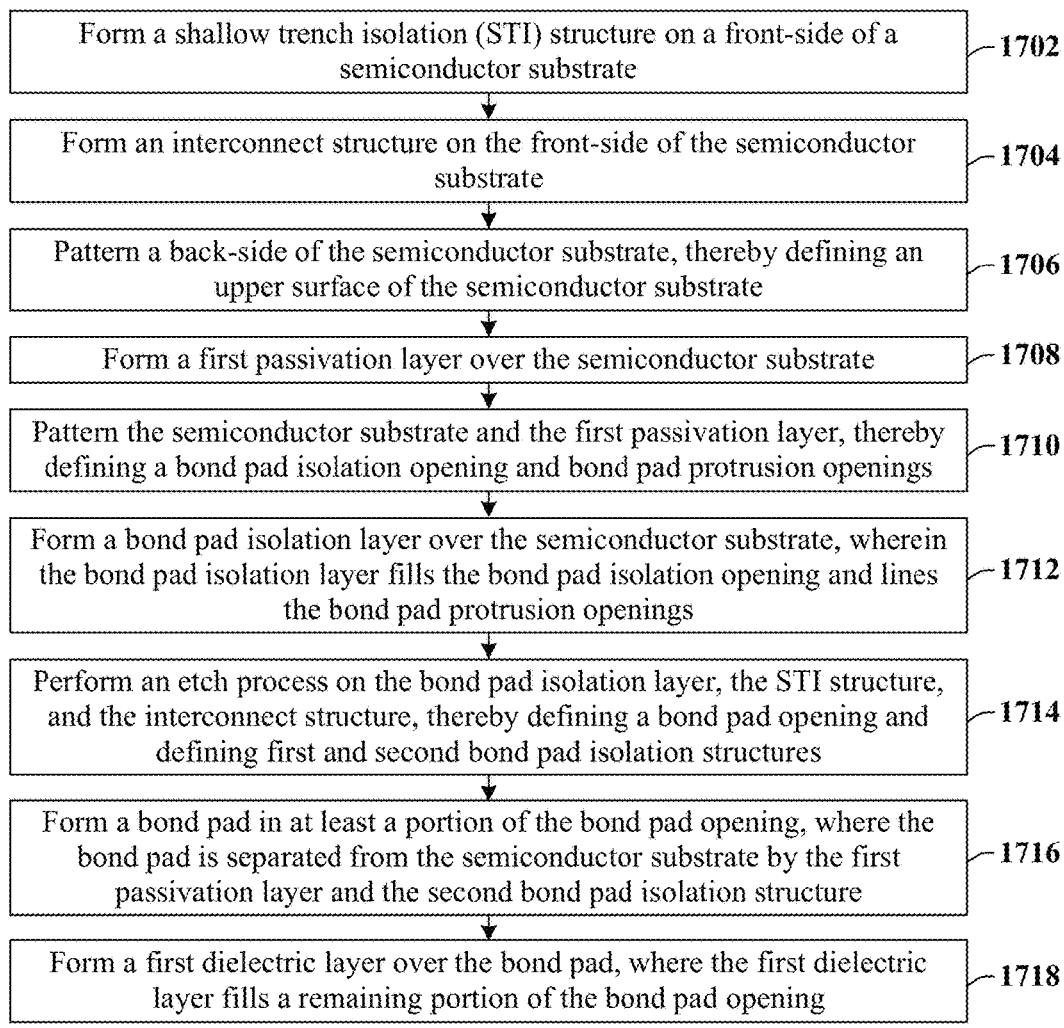
FIG. 17 illustrates a block diagram of some embodiments of the method of FIGS. 6-16.

FIG. 17 illustrates a method 1700 of forming a bond pad with a reduced step height and a bond pad isolation structure surrounding the bond pad according to the present disclosure. Although the method 1700 illustrates and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1702, a shallow trench isolation (STI) structure is formed on a front-side of a semiconductor substrate. FIG. 6 illustrates a cross-sectional view 600 corresponding to some embodiments of act 1702.

At act 1704, an interconnect structure is formed on the front-side of the semiconductor substrate. FIG. 7 illustrates a cross-sectional view 700 corresponding to some embodiments of act 1704.

At act 1706, a back-side of the semiconductor substrate is patterned, thereby defining an upper surface of the semiconductor substrate. FIG. 9 illustrates a cross-sectional view 900 corresponding to some embodiments of act 1706.

At act 1708, a first passivation layer is formed over the semiconductor substrate. FIG. 9 illustrates a cross-sectional view 900 corresponding to some embodiments of act 1708.

At act 1710, the semiconductor substrate and the first passivation layer are patterned, thereby defining a bond pad isolation opening and bond pad protrusion openings. FIG. 10 illustrates a cross-sectional view 1000 corresponding to some embodiments of act 1710.

At act 1712, a bond pad isolation layer is formed over the semiconductor substrate. The bond pad isolation layer fills the bond pad isolation opening and lines the bond pad protrusion openings. FIG. 11 illustrates a cross-sectional view 1100 corresponding to some embodiments of act 1712.

At act 1714, the bond pad isolation layer, the STI structure, and the interconnect structure are etched, thereby defining a bond pad opening and defining first and second bond pad isolation structures. FIG. 12 illustrates a cross-sectional view 1200 corresponding to some embodiments of act 1714.

At act 1716, a bond pad is formed in at least a portion of the bond pad opening. The bond pad is separated from the semiconductor substrate by the first passivation layer and the second bond pad isolation structure. FIGS. 13 and 14 illustrate cross-sectional views 1300 and 1400 corresponding to some embodiments of act 1716.

At act 1718, a first dielectric layer is formed over the bond pad. The first dielectric layer fills a remaining portion of the bond pad opening. FIG. 15 illustrates a cross-sectional view 1500 corresponding to some embodiments of act 1718.

Accordingly, in some embodiments, the present disclosure relates to a bond pad laterally extending through a semiconductor substrate and laterally offset from a device region. An upper surface of the bond pad is vertically below a back-side surface of the semiconductor substrate by a reduced step height. First and second bond pad isolation structures electrically isolate the bond pad from semiconductor devices (e.g., photodetectors, transistors, etc.) disposed within the device region.

In some embodiments, the present application provides a semiconductor structure, including a semiconductor substrate having a back-side surface and a front-side surface opposite the back-side surface, wherein an upper surface of the semiconductor substrate is vertically below the back-side surface; a bond pad extending through the semiconductor substrate, wherein the bond pad includes a conductive body over the upper surface of the semiconductor substrate and conductive protrusions extending from above the upper surface to below the front-side surface of the semiconductor substrate, and wherein a vertical distance between a top surface of the bond pad and the back-side surface of the semiconductor substrate is less than a height of the conductive protrusions; and a first bond pad isolation structure extending through the semiconductor substrate and laterally surrounding the conductive protrusions.

In some embodiments, the present application provides a semiconductor structure, including a first substrate overlying a second substrate and including a top surface vertically above an upper surface, wherein photodetectors are disposed in the first substrate; an interconnect structure disposed between the first substrate and the second substrate, wherein an upper conductive wire layer is disposed within the interconnect structure; a bond pad overlying the upper surface of the first substrate and extending through the first substrate to the interconnect structure, wherein the bond pad contacts the upper conductive wire layer and is laterally offset from the photodetectors, and wherein a vertical distance between the top surface of the first substrate and a top surface of the bond pad is less than a height of the bond pad overlying the upper surface of the first substrate; a first bond pad isolation structure disposed within the first substrate and laterally surrounding outer sidewalls of the bond pad; and second bond pad isolation structures disposed within the first substrate, wherein the second bond pad isolation structures directly contact sidewalls of the bond pad that extend through the first substrate.

In some embodiments, the present application provides a method for forming a semiconductor structure, the method includes forming a shallow trench isolation (STI) structure on a front-side surface of a substrate; forming an interconnect structure on the front-side surface of the substrate, wherein the interconnect structure includes a conductive wire layer; patterning the substrate to define an upper surface of the substrate vertically below a back-side surface of the substrate, wherein the back-side surface is opposite the front-side surface; forming a first passivation layer over the back-side surface of the substrate; patterning the first passivation layer and the substrate to define a bond pad isolation opening and bond pad protrusion openings, wherein the patterning of the first passivation layer and the substrate exposes an upper surface of the STI structure; depositing a bond pad isolation layer over the substrate, wherein the bond pad isolation layer fills the bond pad isolation opening and lines the bond pad protrusion openings; etching the bond pad isolation layer and the STI structure to expose an upper surface of the conductive wire layer and define first and second bond pad isolation structures; and forming a bond pad over the conductive wire layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate having a back-side surface and a front-side surface opposite the back-side surface, wherein an upper surface of the semiconductor substrate is vertically below the back-side surface;
a bond pad extending through the semiconductor substrate, wherein the bond pad comprises a conductive body over the upper surface of the semiconductor substrate and conductive protrusions extending from above the upper surface to below the front-side surface of the semiconductor substrate, and wherein a vertical distance between a top surface of the bond pad and the back-side surface of the semiconductor substrate is less than a height of the conductive protrusions;
a conductive ring structure overlying the upper surface of the semiconductor substrate, wherein the conductive ring structure laterally surrounds the conductive body and has a top surface aligned with the top surface of the bond pad; and
a first bond pad isolation structure extending through the semiconductor substrate and laterally surrounding the conductive protrusions.

2. The semiconductor structure of claim 1, further comprising:
second bond pad isolation structures disposed around the conductive protrusions, wherein the second bond pad isolation structures are disposed between the conductive protrusions and inner sidewalls of the semiconductor substrate; and
wherein the first and second bond pad isolation structures comprise a same dielectric material.

3. The semiconductor structure of claim 2, wherein the height of the conductive protrusions is greater than a height of the first and second bond pad isolation structures.

4. The semiconductor structure of claim 2, wherein the second bond pad isolation structures directly contact sidewalls of the conductive protrusions, and wherein the first bond pad isolation structure is laterally offset from the conductive protrusions by a non-zero distance.

5. The semiconductor structure of claim 1, wherein the vertical distance between the top surface of the bond pad and the back-side surface of the semiconductor substrate is less than a height of the conductive body.

6. The semiconductor structure of claim 1, further comprising:
a passivation structure overlying the semiconductor substrate, wherein the passivation structure is disposed between the conductive body and the upper surface of the semiconductor substrate; and
a shallow trench isolation (STI) structure disposed along the front-side surface of the semiconductor substrate, wherein the bond pad is laterally spaced between sidewalls of the STI structure.

7. The semiconductor structure of claim 6, wherein the first bond pad isolation structure continuously extends from the passivation structure to the STI structure.

8. The semiconductor structure of claim 1, wherein when viewed from above the first bond pad isolation structure is ring-shaped.

9. The semiconductor structure of claim 1, wherein the conductive ring structure comprises a same material as the bond pad.

10. The semiconductor structure of claim 9, wherein the first bond pad isolation structure is laterally spaced between sidewalls of the conductive ring structure.

11. A semiconductor structure, comprising:
a first substrate overlying a second substrate and comprising a top surface vertically above an upper surface, wherein photodetectors are disposed in the first substrate;
an interconnect structure disposed between the first substrate and the second substrate, wherein an upper conductive wire layer is disposed within the interconnect structure;

a bond pad overlying the upper surface of the first substrate and extending through the first substrate to the interconnect structure, wherein the bond pad contacts the upper conductive wire layer and is laterally offset from the photodetectors, wherein a vertical distance between the top surface of the first substrate and a top surface of the bond pad is less than a height of the bond pad overlying the upper surface of the first substrate, wherein the bond pad comprises a conductive body overlying the upper surface of the first substrate and a plurality of conductive protrusions that continuously extend from a bottom surface of the conductive body to the upper conductive wire layer;

a first bond pad isolation structure disposed within the first substrate and laterally surrounding outer sidewalls of the bond pad; and second bond pad isolation structures disposed within the first substrate, wherein the second bond pad isolation structures respectively directly contact opposing sidewalls of an individual conductive protrusion in the plurality of conductive protrusions and continuously vertically extend from the bottom surface of the conductive body to a point aligned with a bottom surface of the first bond pad isolation structure.

12. The semiconductor structure of claim 11, further comprising:

a passivation structure overlying the first substrate, wherein the passivation structure continuously extends from over the photodetectors to over the upper surface of the first substrate; and a first dielectric layer overlying the bond pad, wherein an upper surface of the first dielectric layer is aligned with an upper surface of the passivation structure, and wherein a height of the first dielectric layer is less than a height of the plurality of conductive protrusions.

13. The semiconductor structure of claim 11, wherein the point is vertically above a bottom surface of the plurality of conductive protrusions.

14. The semiconductor structure of claim 11, wherein the conductive body comprises sidewalls that define bond pad openings directly overlying the conductive protrusions, wherein an electrical connector pad overlies the bond pad and is laterally spaced between the bond pad openings.

15. The semiconductor structure of claim 11, further comprising:

a plurality of light filters overlying the photodetectors, wherein the light filters are configured to pass near infrared radiation (NIR); and wherein a thickness of the first substrate is within a range of 3.5 to 6 micrometers.

16. The semiconductor structure of claim 11, wherein the bond pad and the upper conductive wire layer comprise a same conductive material.

17. A semiconductor structure, comprising:

a semiconductor substrate having a back-side surface opposite a front-side surface;

a shallow trench isolation (STI) structure disposed along the front-side surface of the semiconductor substrate;

a bond pad extending through the semiconductor substrate, wherein the bond pad comprises a conductive body overlying the front-side surface and conductive protrusions extending from the conductive body through the semiconductor substrate and the STI structure to a point below a bottom surface of the STI structure;

a first bond pad isolation structure extending through the semiconductor substrate and laterally surrounding the conductive protrusions, wherein a bottom surface of the first bond pad isolation structure directly contacts an upper surface of the STI structure, wherein outer sidewalls of the first bond pad isolation structure are spaced laterally between outer sidewalls of the STI structure; and second bond pad isolation structures disposed along opposing sidewalls of the conductive protrusions, wherein the second bond pad isolation structures are disposed between the conductive protrusions and inner sidewalls of the first bond pad isolation structure.

18. The semiconductor structure of claim 17, wherein the second bond pad isolation structures continuously extend from the conductive body of the bond pad to the upper surface of the STI structure.

19. The semiconductor structure of claim 17, wherein the conductive protrusions directly contact opposing inner sidewalls of the STI structure.

20. The semiconductor structure of claim 17, wherein a bottom surface of the second bond pad isolation structures is aligned with the bottom surface of the first bond pad isolation structure.

* * * * *